(12) United States Patent
Kim et al.

(10) Patent No.: US 11,915,767 B2
(45) Date of Patent: Feb. 27, 2024

(54) NEGATIVE VOLTAGE SWITCHING DEVICE AND NON-VOLATILE MEMORY DEVICE USING THE SAME

(71) Applicant: KEY FOUNDRY CO., LTD., Cheongju-si (KR)

(72) Inventors: Jin Hyung Kim, Goyang-si (KR); Sung Bum Park, Seongnam-si (KR); Kee Sik Ahn, Hwaseong-si (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 163 days.

(21) Appl. No.: 17/568,190

(22) Filed: Jan. 4, 2022

(65) Prior Publication Data
US 2023/0065879 A1 Mar. 2, 2023

(30) Foreign Application Priority Data
Aug. 24, 2021 (KR) .................. 10-2021-0111861

(51) Int. Cl.
| | | |
|---|---|---|
| *G11C 16/14* | (2006.01) | |
| *G11C 16/30* | (2006.01) | |
| *G11C 16/04* | (2006.01) | |
| *H03K 17/687* | (2006.01) | |
| *H03K 17/693* | (2006.01) | |

(52) U.S. Cl.
CPC .......... *G11C 16/30* (2013.01); *G11C 16/0433* (2013.01); *G11C 16/14* (2013.01); *H03K 17/6872* (2013.01); *H03K 17/693* (2013.01); *G11C 2216/04* (2013.01)

(58) Field of Classification Search
CPC ..... G11C 16/30; G11C 16/0433; G11C 16/14; G11C 2216/04; G11C 7/12; G11C 8/10; G11C 16/16; G11C 16/10; H03K 17/6872; H03K 17/693
See application file for complete search history.

(56) References Cited

U.S. PATENT DOCUMENTS

| | | | |
|---|---|---|---|
| 9,595,966 B2 | 3/2017 | Kim et al. | |
| 2016/0078947 A1* | 3/2016 | Yanagida | G11C 16/0483 365/185.18 |
| 2019/0080776 A1* | 3/2019 | Bushnaq | G11C 16/08 |

FOREIGN PATENT DOCUMENTS

KR  10-1104642 B1  1/2012

* cited by examiner

*Primary Examiner* — Xiaochun L Chen
(74) *Attorney, Agent, or Firm* — NSIP Law (57) ABSTRACT

A negative voltage switching device includes a first switching circuit configured to transmit a first negative voltage, a second switching circuit configured to transmit a second negative voltage, and a switching selection circuit configured to select one of the first switching circuit or the second switching circuit for transmitting one of the first negative voltage and the second negative voltage to an output terminal.

27 Claims, 4 Drawing Sheets

NEGATIVE VOLTAGE SWITCHING DEVICE AND NON-VOLATILE MEMORY DEVICE USING THE SAME

CROSS-REFERENCE TO RELATED APPLICATION

This application claims the benefit under 35 U.S.C. § 119 of Korean Patent Application No. 10-2021-0111861 filed on Aug. 24, 2021 in the Korean Intellectual Property Office, the entire disclosure of which is incorporated herein by reference for all purposes.

BACKGROUND

1. Field

The following disclosure relates to a negative voltage switching device and a non-volatile memory device using the same.

2. Description of Related Art

A non-volatile memory device uses a voltage similar to a power voltage applied to a circuit in performing a read operation. However, when performing a program and erase operation, injecting or removing a charge to a floating gate surrounded by an insulating film, a positive voltage that is higher than a power voltage and a negative voltage that is lower than a ground voltage are desired. Therefore, a circuit that applies a voltage to a floating gate has to output a positive and negative voltage, besides a power and ground voltage.

In the prior art, when a positive voltage and a negative voltage are applied that are bigger than a drain-body breakdown voltage of a transistor, a drain-body breakdown phenomenon is prevented, applying a positive voltage and a negative voltage. However, a positive voltage or a negative voltage may be selected and applied for an output node, but it is not possible to select and apply one of two negative voltages, which is a problem.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In one general aspect, a negative voltage switching device includes a first switching circuit configured to transmit a first negative voltage, a second switching circuit configured to transmit a second negative voltage, and a switching selection circuit configured to select one of the first switching circuit or the second switching circuit for transmitting one of the first negative voltage and the second negative voltage to an output terminal.

The first switching circuit may include a first switching module connected to a second control signal terminal configured to apply a control signal to select one of the first negative voltage and the second negative voltage, a second switching module connected to a first control signal terminal configured to apply a control signal to supply the first negative voltage or the second negative voltage to the switching selection circuit, and a twelfth N-type transistor configured to supply the first negative voltage to the switching selection circuit by turning on, when the first negative voltage is selected.

The first switching module may include a first P-type transistor having a source connected to a positive voltage terminal to supply a positive voltage, and a gate connected to the second control signal terminal; a second P-type transistor having a source connected to the positive voltage terminal, and a gate connected to the second control signal terminal; a first N-type transistor having a source connected to a first negative voltage terminal to supply the first negative voltage, and a drain connected to a drain of the first P-type transistor; and a second N-type transistor having a source connected to the first negative voltage terminal to supply the first negative voltage, and a drain connected to a drain of the second P-type transistor. The drain of the first P-type transistor and a gate of the second N-type transistor may be connected, and a drain of the second P-type transistor and a gate of the first N-type transistor may be connected.

The second switching module may include a third P-type transistor having a source connected to the first control signal terminal; a fourth P-type transistor having a source connected to the first control signal terminal; a third N-type transistor having a source connected to a first negative voltage terminal to supply the first negative voltage, and a drain connected to a drain of the third P-type transistor; and a fourth N-type transistor having a source connected to the first negative voltage terminal to supply the first negative voltage, and a drain connected to a drain of the fourth P-type transistor. A gate of the third P-type transistor and the drain of the fourth N-type transistor may be connected, and a gate of the fourth P-type transistor and the drain of the third N-type transistor may be connected.

A source of the twelfth N-type transistor may be connected to the first negative voltage terminal, a gate of the twelfth N-type transistor may be connected to each drain of the fourth P-type transistor and the fourth N-type transistor, and a gate of the third P-type transistor, and a drain of the twelfth N-type transistor may be connected to the switching selection circuit.

The second switching circuit may include a third switching module connected to a second control signal terminal configured to apply a control signal to select one of the first negative voltage and the second negative voltage; a fourth switching module connected to a first control signal terminal configured to apply a control signal to supply the first negative voltage or the second negative voltage to the switching selection circuit; a fifth switching module connected to another negative voltage terminal different from a negative voltage terminal of the fourth switching module, and connected to the first control signal terminal; and an eleventh N-type transistor configured to supply the second negative voltage to the switching selection circuit by turning on, when the second negative voltage is selected.

The third switching module may include a fifth P-type transistor having a source connected to a positive voltage terminal to supply a positive voltage, and a gate connected to the second control signal terminal; a sixth P-type transistor having a source connected to the positive voltage terminal, and a gate connected to the second control signal terminal; a fifth N-type transistor having a source connected to a first negative voltage terminal to supply the first negative voltage, and a drain connected to a drain of the fifth P-type transistor; and a sixth N-type transistor having a source connected to a first negative voltage terminal to supply the first negative voltage, and a drain connected to a drain of the sixth P-type transistor. The drain of the fifth P-type transistor and a gate of the sixth N-type transistor may be connected, and the drain of the sixth P-type transistor and a gate of the fifth N-type transistor may be connected.

The fourth switching module may include a seventh P-type transistor having a source connected to the first control signal terminal; an eighth P-type transistor having a source connected to the first control signal terminal; a seventh N-type transistor having a source connected to a first negative voltage terminal to supply the first negative voltage, and a drain connected to a drain of the seventh P-type transistor; and an eighth N-type transistor having a source connected to the first negative voltage terminal, and a drain connected to a drain of the eighth P-type transistor. A gate of the seventh P-type transistor and the drain of the eighth N-type transistor may be connected, and a gate of the eighth P-type transistor and the drain of the seventh N-type transistor may be connected.

The fifth switching module may include a ninth P-type transistor having a source connected to the first control signal terminal; a tenth P-type transistor having a source connected to the first control signal terminal; a ninth N-type transistor having a source connected to a second negative voltage terminal configured to supply the second negative voltage, and a drain connected to a drain of the ninth P-type transistor; and a tenth N-type transistor having a source connected to the second negative voltage terminal, and a drain connected to a drain of the tenth P-type transistor. The drain of the ninth P-type transistor and a gate of the tenth N-type transistor may be connected, and the drain of the tenth P-type transistor and a gate of the ninth N-type transistor may be connected.

A source of the eleventh N-type transistor may be connected to the second negative voltage terminal, a gate of the eleventh N-type transistor may be connected to each drain of the tenth P-type transistor and the tenth N-type transistor, and a gate of the ninth P-type transistor, and a drain of the eleventh N-type transistor may be connected to the switching selection circuit.

The switching selection circuit may include a first switching selection module connected to the first switching circuit and the second switching circuit, and a second switching selection module connected to the second switching circuit.

The first switching selection module may include a thirteenth N-type transistor having a source connected to the first switching circuit, a gate connected to the second switching circuit, and a drain connected to an output terminal; a fourteenth N-type transistor having a drain connected to the first switching circuit, a gate connected to the output terminal, and a source connected to the thirteenth N-type transistor; and a fifteenth N-type transistor having a drain connected to the output terminal, a gate connected to the source of the fourteenth N-type transistor, and a source connected to the thirteenth N-type transistor.

The second switching selection module may include a sixteenth N-type transistor having a source connected to the second switching circuit, and a gate connected to the output terminal; a seventeenth N-type transistor having a drain connected to the output terminal, a gate connected to the second switching circuit, and a source connected to a source of the sixteenth N-type transistor; and an eighteenth N-type transistor having a source connected to the second switching circuit, a gate connected to each source of the sixteenth N-type transistor and the seventeenth N-type transistor, and a drain connected to the output terminal.

The first negative voltage may be higher than the second negative voltage.

In another general aspect, a non-volatile memory device includes a negative voltage switching device, a CG driver configured to receive the first negative voltage in a program mode and the second negative voltage in an erase mode using the negative voltage switching device, a TG driver configured to receive the second negative voltage in the program mode and the first negative voltage in the erase mode using the negative voltage switching device, and a non-volatile memory cell where an erase operation of the erase mode and a program operation of the program mode may be performed by the CG driver and the TG driver, respectively. The negative voltage switching device may include a first switching circuit configured to transmit a first negative voltage, a second switching circuit configured to transmit a second negative voltage, and a switching selection circuit configured to select one of the first switching circuit or the second switching circuit for transmitting one of the first negative voltage and the second negative voltage to an output terminal.

The first switching circuit may include a first switching module connected to a second control signal terminal configured to apply a control signal to select one of the first negative voltage and the second negative voltage, a second switching module connected to a first control signal terminal configured to apply a control signal to supply the first negative voltage or the second negative voltage to the switching selection circuit, and a twelfth N-type transistor to supply the first negative voltage to the switching selection circuit by turning on, when the first negative voltage is selected.

The first switching module may include a first P-type transistor having a source connected to a positive voltage terminal to supply a positive voltage, and a gate connected to the second control signal terminal, a second P-type transistor having a source connected to the positive voltage terminal, and a gate connected to the second control signal terminal, a first N-type transistor having a source connected to a first negative voltage terminal to supply the first negative voltage, and a drain connected to a drain of the first P-type transistor, and a second N-type transistor having a source connected to the first negative voltage terminal to supply the first negative voltage, and a drain connected to a drain of the second P-type transistor. The drain of the first P-type transistor and a gate of the second N-type transistor may be connected, and a drain of the second P-type transistor and a gate of the first N-type transistor may be connected.

The second switching module may include a third P-type transistor having a source connected to the first control signal terminal, a fourth P-type transistor having a source connected to the first control signal terminal, a third N-type transistor having a source connected to a first negative voltage terminal to supply the first negative voltage, and a drain connected to a drain of the third P-type transistor, and a fourth N-type transistor having a source connected to the first negative voltage terminal to supply the first negative voltage, and a drain connected to a drain of the fourth P-type transistor. A gate of the third P-type transistor and the drain of the fourth N-type transistor may be connected, and a gate of the fourth P-type transistor and the drain of the third N-type transistor may be connected.

A source of the twelfth N-type transistor may be connected to the first negative voltage terminal, a gate of the twelfth N-type transistor may be connected to each drain of the fourth P-type transistor and the fourth N-type transistor, and a gate of the third P-type transistor, and a drain of the twelfth N-type transistor may be connected to the switching selection circuit.

The second switching circuit may include a third switching module connected to a second control signal terminal configured to apply a control signal to select one of the first negative voltage and the second negative voltage, a fourth switching module connected to a first control signal terminal configured to apply a control signal to supply the first negative voltage or the second negative voltage to the switching selection circuit, a fifth switching module connected to another negative voltage terminal different from a negative voltage terminal of the fourth switching module, and connected to the first control signal terminal, and an eleventh N-type transistor configured to supply the second negative voltage to the switching selection circuit by turning on, when the second negative voltage is selected.

The third switching module may include a fifth P-type transistor having a source connected to a positive voltage terminal to supply a positive voltage, and a gate connected to the second control signal terminal; a sixth P-type transistor having a source connected to the positive voltage terminal, and a gate connected to the second control signal terminal; a fifth N-type transistor having a source connected to a first negative voltage terminal to supply the first negative voltage, and a drain connected each other to a drain of the fifth P-type transistor; and a sixth N-type transistor having a source connected to a first negative voltage terminal to supply the first negative voltage, and a drain connected to a drain of the sixth P-type transistor. The drain of the fifth P-type transistor and a gate of the sixth N-type transistor may be connected, and the drain of the sixth P-type transistor and a gate of the fifth N-type transistor may be connected.

The fourth switching module may include a seventh P-type transistor having a source connected to the first control signal terminal; an eighth P-type transistor having a source connected to the first control signal terminal; a seventh N-type transistor having a source connected to a first negative voltage terminal to supply the first negative voltage, and a drain connected to a drain of the seventh P-type transistor; and an eighth N-type transistor having a source connected to the first negative voltage terminal, and a drain connected to a drain of the eighth P-type transistor. A gate of the seventh P-type transistor and the drain of the eighth N-type transistor may be connected, and a gate of the eighth P-type transistor and the drain of the seventh N-type transistor may be connected.

The fifth switching module may include a ninth P-type transistor having a source connected to the first control signal terminal, a tenth P-type transistor having a source connected to the first control signal terminal, a ninth N-type transistor having a source connected to a second negative voltage terminal configured to supply the second negative voltage, and a drain connected to a drain of the ninth P-type transistor, and a tenth N-type transistor having a source connected to the second negative voltage terminal, and a drain connected to a drain of the tenth P-type transistor. The drain of the ninth P-type transistor and a gate of the tenth N-type transistor may be connected, and the drain of the tenth P-type transistor and a gate of the ninth N-type transistor may be connected.

A source of the eleventh N-type transistor may be connected to the second negative voltage terminal, a gate of the eleventh N-type transistor may be connected to each drain of the tenth P-type transistor and the tenth N-type transistor, and a gate of the ninth P-type transistor, and a drain of the eleventh N-type transistor may be connected to the switching selection circuit.

The switching selection circuit may include a first switching selection module connected to the first switching circuit and the second switching circuit, and a second switching selection module connected to the second switching circuit.

The first switching selection module may include a thirteenth N-type transistor having a source connected to the first switching circuit, a gate connected to the second switching circuit, and a drain connected to an output terminal; a fourteenth N-type transistor having a drain connected to the first switching circuit, a gate connected to the output terminal, and a source connected to the thirteenth N-type transistor; and a fifteenth N-type transistor having a drain connected to the output terminal, a gate connected to the source of the fourteenth N-type transistor, and a source connected to the thirteenth N-type transistor.

The second switching selection module may include a sixteenth N-type transistor having a source connected to the second switching circuit, and a gate connected to the output terminal; a seventeenth N-type transistor having a drain connected to the output terminal, a gate connected to the second switching circuit, and a source connected to a source of the sixteenth N-type transistor; and an eighteenth N-type transistor having a source connected to the second switching circuit, a gate connected to each source of the sixteenth N-type transistor and the seventeenth N-type transistor, and a drain connected to the output terminal.

The first negative voltage may be higher than the second negative voltage.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Additionally, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

A detailed description is given below for the disclosure, with attached drawings.

The disclosure is to solve problems above and provide a negative voltage switching device to select one of two negative voltages and a non-volatile memory device using the same. In a logic process or a BCD (Bipolar-CMOS-DMOS) process, a negative voltage switching device may be used to embody a non-volatile memory using the minimum number of a mask.

Figure 1:
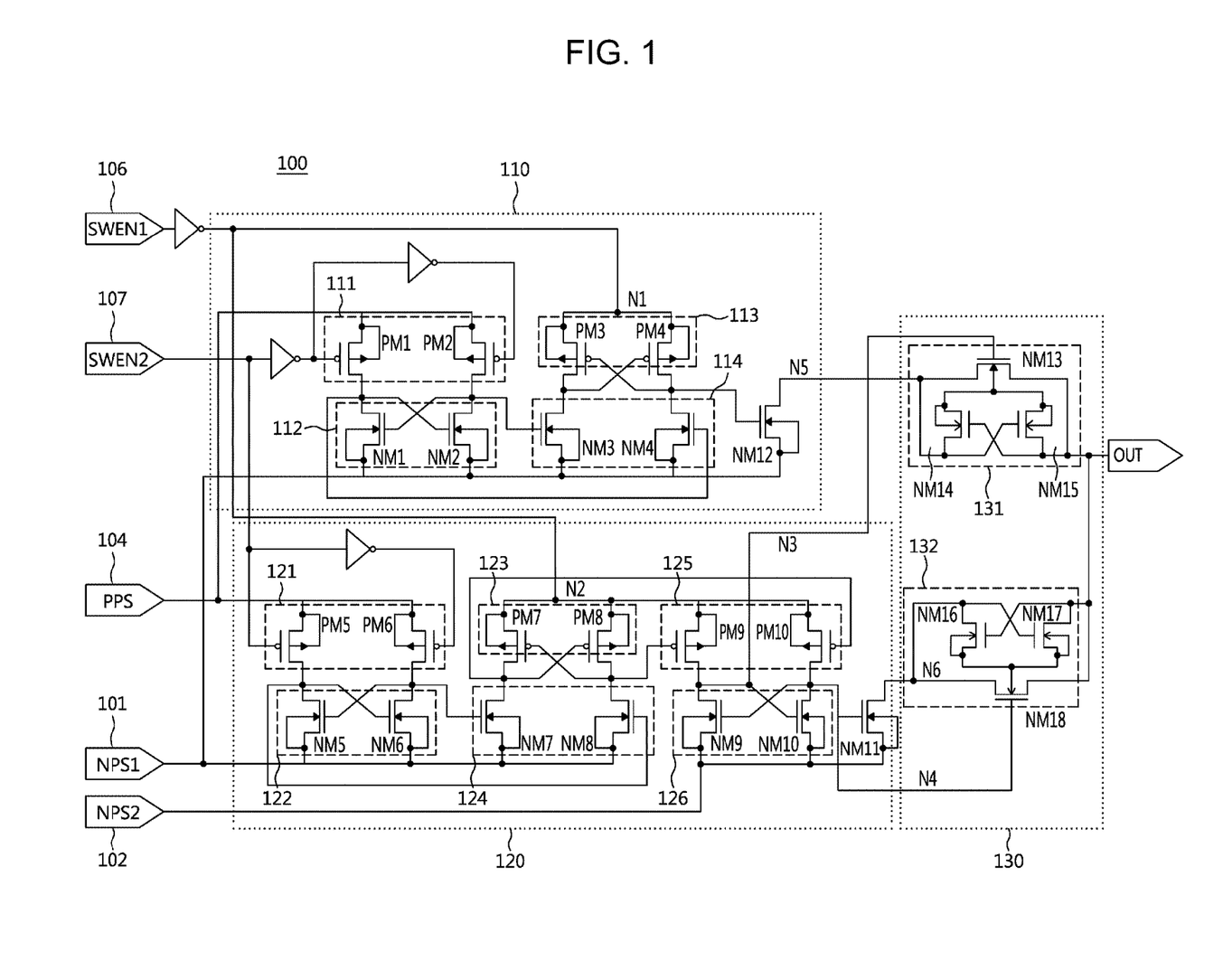
FIG. 1 illustrates an example circuit of a negative voltage switching device in accordance with one or more embodiments of the disclosure.

FIG. 1 illustrates an example circuit of a negative voltage switching device in accordance with one or more embodiments of the disclosure.

Referring to FIG. 1, a negative voltage switching device 100, in accordance with one or more embodiments of the disclosure, may select one of a NPS1 101 or a NPS2 102, which are two different NPSs (negative power supply), and transmit it to an output terminal OUT.

A negative voltage switching device 100 may include a first switching circuit 110 to transmit a first negative voltage; a second switching circuit 120 to transmit a second negative voltage; and a switching selection circuit 130 to select one of the first switching circuit 110 and the second switching circuit 120 to transmit one of the first negative voltage and the second negative voltage to an output terminal, respectively. For convenience, it is assumed that a first negative voltage is supplied from a first negative voltage terminal NPS1 101, and a second negative voltage is supplied from a second negative voltage terminal NPS2 102. Herein, it may be desirable that a first negative voltage is higher than a second negative voltage. For example, when a second negative voltage is −Vpp, a first negative voltage may be −Vpp/3.

It may be possible to transmit a negative voltage to an output terminal OUT by using two control signals. Specifically, by controlling a first control signal terminal SWEN1 106 and a second control signal terminal SWEN2 107, one of a NPS1 101 or a NPS2 102 may be transmitted to an output terminal OUT. Herein, a SWEN2 107 may be a control signal to determine which negative voltage, between a NPS1 101 and NPS2 102, is transmitted to an output terminal OUT. Additionally, a SWEN1 106 may be a control signal that normally supplies a NPS (negative power supply) from a first switching circuit and a second switching circuit 110, 120 to a switching selection circuit 130.

For example, when a SWEN1 106 is logical "0", power is not supplied to a switching selection circuit 130. However, when it is logical "1", a first negative voltage from a NPS1 101 or a second negative voltage from a NPS2 102 may be supplied. Additionally, when a SWEN2 107 is logical "0", a first negative voltage may be transmitted from a NPS1 101 to an output terminal OUT, and when it is logical "1", a second negative voltage may be transmitted from a NPS2 102 to an output terminal OUT.

A first switching circuit 110 may transmit a first negative voltage from a NPS1 101 to a switching selection circuit 130. The switching circuit 110 may include two switching modules and one N-type transistor.

More specifically, a first switching circuit 110 may include a first switching module, connected to a second control signal terminal SWEN2 107, to apply a control signal for selecting one of a first negative voltage and a second negative voltage; a second switching module, connected to a first control signal terminal SWEN1 106, to apply a control signal for supplying the first negative voltage or the second negative voltage to a switching selection circuit 130; and a twelfth N-type transistor NM12 to supply a first negative voltage to a switching selection circuit 130 by turning on when the first negative voltage is selected.

The first switching module may include a pair of P-type transistors 111 and a pair of N-type transistors 112. A positive voltage terminal PPS 104, the second control signal terminal SWEN2 107 connected to the first switching module, and a first negative voltage terminal NPS1 101 may be connected.

More specifically, in the first switching module, a source that supplies a positive voltage may be connected to a positive voltage terminal PPS 104. The first switching module may include a first P-type transistor PM1 having a gate connected to a second control signal terminal 107; a second P-type transistor PM2 having a source connected to the positive voltage terminal PPS 104, and a gate connected to the second control signal terminal 107; a first N-type transistor NM1 having a source connected to a first negative voltage terminal 101 that supplies a first negative voltage, and a drain connected to a drain of the first P-type transistor PM1; and a second N-type transistor NM2 having a source connected to a first negative voltage terminal 101 that supplies a first negative voltage, and a drain connected to a drain of a second P-type transistor PM2.

A drain of a first P-type transistor PM1 and a gate of a second N-type transistor NM2 are connected. A drain of a second P-type transistor PM2 and a gate of a first N-type transistor NM1 are connected. Drains of a second P-type transistor PM2 and a second N-type transistor NM2, and a gate of a first N-type transistor NM1 are connected to a second switching module.

A second switching module may include a pair of P-type transistors 113 and a pair of N-type transistors 114, and a first control signal terminal SWEN1 106 and a first negative voltage terminal NPS1 101 may be connected.

More specifically, a second switching module may include a third P-type transistor PM3 having a source connected to a first control signal terminal 106; a fourth P-type transistor PM4 having a source connected to a first control signal terminal 106; a third N-type transistor NM3 having a source connected to a first negative voltage terminal 101 that supplies a first negative voltage, and a drain connected to a drain of a third P-type transistor PM3; and a fourth N-type transistor NM4 having a source connected to a first negative voltage terminal 101 that supplies a first negative voltage, and a drain connected to a drain of a fourth P-type transistor PM4.

A gate of the third P-type transistor PM3 and a drain of the fourth N-type transistor NM4 are connected. A gate of the fourth P-type transistor PM4 and a drain of the third N-type transistor NM3 are connected. Drains of the fourth P-type transistor PM4 and the fourth N-type transistor NM4, and a gate of the third P-type transistor PM3 are connected to a twelfth N-type transistor NM12. Additionally, drains of the second P-type transistor PM2 and the second N-type transistor NM2, and a gate of the first N-type transistor NM1 are connected to a gate of the third N-type transistor NM3.

In the twelfth N-type transistor NM12, a source may be connected to a first negative voltage terminal 101. A gate of the twelfth N-type transistor NM12 may be connected to each of the drains of the fourth P-type transistor PM4 and the fourth N-type transistor NM4, and a gate of the third P-type transistor PM3. A drain of the twelfth N-type transistor NM12 may be connected to a switching selection circuit 130. A drain of a twelfth N-type transistor NM12 may be connected to sources of a thirteenth and fourteenth N-type transistor NM13, NM14 of the switching selection circuit 130.

When 0V is applied to an N1 node and an N2 node, the twelfth N-type transistor NM12 may be turned on, and a first negative voltage of an NSP1 may be transmitted to an N5 node. An N3 node may become 0V, a thirteenth N-type transistor NM13 may be turned on, and a first negative voltage transmitted to an N5 may be transmitted to an output terminal OUT.

A second switching circuit 120 may transmit a second negative voltage from a NPS2 102 to a switching selection circuit 130. The second switching circuit 120 may include three switching modules and one N-type transistor.

More specifically, the second switching circuit 120 may include a third switching module connected to a second control signal terminal SWEN2 107 that applies a control signal to select one of a first negative voltage and a second negative voltage; a fourth switching module connected to a first control signal terminal SWEN1 106 that applies a control signal to supply the first negative voltage or the second negative voltage to a switching selection circuit 130; a fifth switching module connected to another negative voltage terminal that is different from the fourth switching module, and connected to a first control signal terminal 106 that applies a control signal to supply the first negative voltage or the second negative voltage to a switching selection circuit 130; and an eleventh N-type transistor NM11 to supply the second negative voltage to a switching selection circuit 130 by turning on when the second negative voltage is selected.

The third switching module may include a pair of P-type transistors 121 and a pair of N-type transistors 122. In addition, a positive voltage terminal PPS 104, a second control signal terminal SWEN2 107, and a first negative voltage terminal NPS1 101 may be connected.

More specifically, a third switching module may include a fifth P-type transistor PM5 having a source connected to a positive voltage terminal PPS 104 that supplies a positive voltage, and a gate connected to a second control signal terminal 107; a sixth P-type transistor PM6 having a source connected to a positive voltage terminal PPS 104, and a gate connected to a second control signal terminal 107; a fifth N-type transistor NM5 having a source connected to a first negative voltage terminal 101 that supplies a first negative voltage, and a drain connected to a drain of the fifth P-type transistor PM5; and a sixth N-type transistor NM6 having a source connected to a first negative voltage terminal 101 that supplies a first negative voltage, and a drain connected to a drain of the sixth P-type transistor PM6.

A drain of a fifth P-type transistor PM5 and a gate of a sixth N-type transistor NM6 are connected. A drain of a sixth P-type transistor PM6 and a gate of the fifth N-type transistor NM5 are connected. Drains of a sixth P-type transistor PM6 and a sixth N-type transistor NM6 and a gate of a fifth N-type transistor NM5 are connected to a fourth switching module.

A fourth switching module may include a pair of P-type transistors 123 and a pair of N-type transistors 124. A first control signal terminal SWEN1 106 and a first negative voltage terminal NPS1 101 may be connected.

More specifically, a fourth switching module may include a seventh P-type transistor PM7 where a source is connected to a first control signal terminal 106; an eighth P-type transistor PM8 where a source is connected to a first control signal terminal 106; a seventh N-type transistor NM7 where a source is connected to a first negative voltage terminal 101 that supplies a first negative voltage, and a drain is connected each other to a drain of the seventh P-type transistor PM7; and an eighth N-type transistor NM8 where a source is connected to a first negative voltage terminal 101 that supplies a first negative voltage, and a drain is connected each other to a drain of the eighth P-type transistor PM8.

A gate of a seventh P-type transistor PM7 and a drain of an eighth N-type transistor NM8 are connected. A gate of an eighth P-type transistor PM8 and a drain of the seventh N-type transistor NM7 are connected. Drains of an eighth P-type transistor PM8 and an eighth N-type transistor NM8 and a gate of a seventh P-type transistor PM7 are connected to a gate of a ninth P-type transistor PM9 of a fifth switching module. Additionally, a gate of an eighth P-type transistor PM8 is connected to drains of a fifth P-type transistor PM5 and a fifth N-type transistor NM5 of a third switching module and to a gate of a sixth N-type transistor NM6.

A fifth switching module may include a pair of P-type transistors 125 and a pair of N-type transistors 126. A first control signal terminal SWEN1 106 and a second negative voltage terminal NPS2 102 may be connected.

More specifically, a fifth switching module may include a ninth P-type transistor PM9 where a source is connected to a first control signal terminal 106; a tenth P-type transistor PM10 where a source is connected to a first control signal terminal 106; a ninth N-type transistor NM9 where a source is connected to a second negative voltage terminal 102 that supplies a second negative voltage, and a drain is connected each other to a drain of the ninth P-type transistor PM9; and a tenth N-type transistor NM10 where a source is connected to a second negative voltage terminal 102 that supplies a second negative voltage, and a drain is connected each other to a drain of the tenth P-type transistor PM10.

A drain of a ninth P-type transistor PM9 and a gate of a tenth N-type transistor NM10 are connected. A drain of a tenth P-type transistor PM10 and a gate of a ninth N-type transistor NM9 are connected. A gate of a ninth P-type transistor PM9 is connected to drains of an eighth P-type transistor PM8 and an eighth N-type transistor NM8 of a fourth switching module and to a gate of a seventh P-type transistor PM7. Additionally, A gate of a tenth P-type transistor PM10 is connected to drains of a seventh P-type transistor PM7 and a seventh N-type transistor NM7 of a fourth switching module and to a gate of an eighth P-type transistor PM8. Drains of a tenth P-type transistor PM10 and a tenth N-type transistor NM10 and a gate of a ninth N-type transistor NM9 are connected to an eleventh N-type transistor NM11.

In an eleventh N-type transistor NM11, a source may be connected to a second negative voltage terminal 102. A gate may be connected to each drain of a tenth P-type transistor PM10 and a tenth N-type transistor NM10, and a gate of a ninth P-type transistor PM9. A drain may be connected to a switching selection circuit 130. A drain of an eleventh N-type transistor NM11 may be connected to sources of a sixteenth and eighteenth N-type transistor NM16, NM18 of a switching selection circuit 130.

When 0V is applied to an N1 node and an N2 node, an eleventh N-type transistor NM11 may be turned on, and a second negative voltage of an NSP2 may be transmitted to an N6 node. A second negative voltage may be transmitted to an N3 node through a ninth N-type transistor NM9, and accordingly, a thirteenth N-type transistor NM13 may be turn-off, and a first negative voltage may not affect an output terminal OUT by making a twelfth N-type transistor NM12 turn-off.

A switching selection circuit 130 may include a first switching selection module 131 connected to a first switching circuit 110 and a second switching circuit 120, and a second switching selection module 132 connected to a second switching circuit 120.

A first switching selection module 131 and a second switching selection module 132 may each include 3 N-type transistors. For example, a second switching circuit 120 may be only connected to a second switching selection module 132, and a first switching circuit 110 may be connected to both a first switching selection module 131 and a second switching selection module 132.

A first switching selection module 131 may include a thirteenth N-type transistor NM13 where a source is connected to a first switching circuit 110, a gate is connected to a second switching circuit 120, and a drain is connected to an output terminal OUT; a fourteenth N-type transistor NM14 where a drain is connected to a first switching circuit 110, a gate is connected to an output terminal OUT, and a source is connected to the thirteenth N-type transistor NM13; and a fifteenth N-type transistor NM15 where a drain is connected to an output terminal OUT, a gate is connected to a source of the fourteenth N-type transistor NM14, and a source is connected to the thirteenth N-type transistor NM13.

More specifically, a source of a thirteenth N-type transistor NM13 may be connected to a drain of a twelfth N-type transistor NM12. A gate of a thirteenth N-type transistor NM13 may be connected to each drain of a ninth P-type transistor PM9 and a ninth N-type transistor NM9 and a gate of a tenth N-type transistor NM10.

A second switching selection module 132 may include a sixteenth N-type transistor NM16 where a source is connected to a second switching circuit 120, a gate is connected to an output terminal OUT; a seventeenth N-type transistor NM17 where a drain is connected to an output terminal OUT, a gate is connected to a second switching circuit 120, and a source is connected each other to a source of the sixteenth N-type transistor NM16; and an eighteenth N-type transistor NM18 where a source is connected to a second switching circuit 120, a gate is connected to each source of the sixteenth N-type transistors NM16 and the seventeenth NM17, and a drain is connected to an output terminal OUT.

More specifically, each drain of a sixteenth N-type transistors NM16 and an eighteenth N-type transistor NM18 may be connected to a drain of an eleventh N-type transistor NM11.

To select one of two different negative powers NPS1, NPS2, two switching circuits 110, 120 may be used to transmit a negative power. According to a switching selection circuit 130 to select one of them, a first negative voltage or a second negative voltage may be selected.

Figure 2:
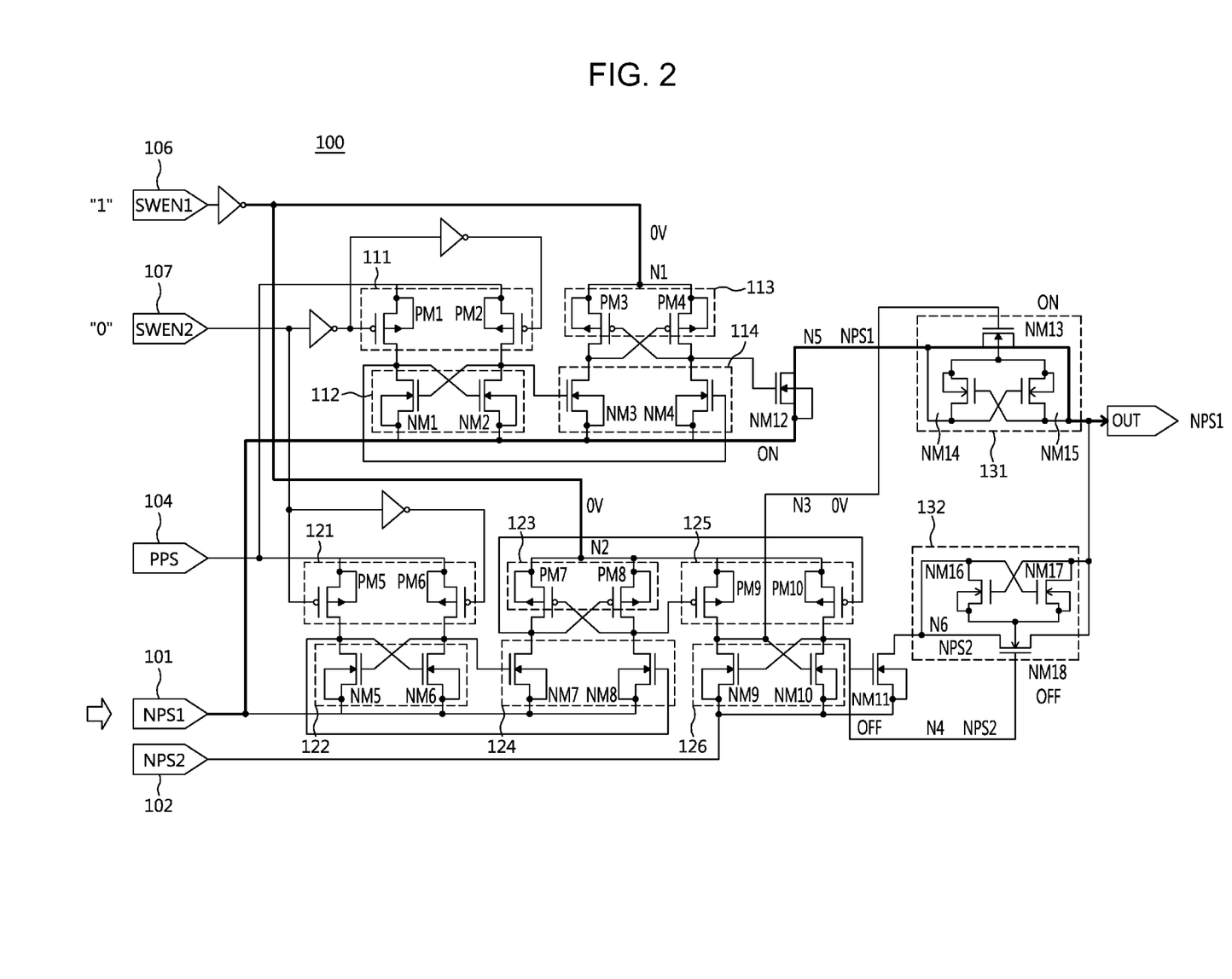
FIG. 2 illustrates an example selecting a first negative voltage in a circuit of a negative voltage switching device as shown in FIG. 1, in accordance with one or more embodiments of the disclosure.

FIG. 2 illustrates an example selecting a first negative voltage in a circuit of a negative voltage switching device as shown in FIG. 1, in accordance with one or more embodiments of the disclosure.

Referring to FIG. 2, by making a SWEN1 106 be logical "1", a negative voltage may be transmitted to an output terminal OUT. The bolded lines illustrate a SWEN1 signal path or a NSP1 101 signal path.

First, by making a SWEN2 107 be logical "0", a NPS1 101 may be transmitted to an output terminal OUT.

By selecting a NPS1 101 and making a SWEN1 106 be logical "1", it may be possible to operate devices of a third P-type transistor PM3, a fourth P-type transistor PM4, a seventh P-type transistor PM7, an eighth P-type transistor PM8, a ninth P-type transistor PM9, a tenth P-type transistor PM10, a third N-type transistor NM3, a fourth N-type transistor NM4, a seventh N-type transistor NM7, an eighth N-type transistor NM8, a ninth N-type transistor NM9, and a tenth N-type transistor NM10 below a breakdown voltage.

0V may be supplied to an N1 node and an N2 node, and a first negative voltage may be transmitted to an N5 node according to a NPS1 101, as a twelfth N-type transistor NM12 is turned on. An N3 node may become 0V, resulting in turning on a thirteenth N-type transistor NM13. A first negative voltage may be transmitted to an output terminal OUT according to a NPS1 101 transmitted in an N5 node. Herein, a second negative voltage from NPS2 102 may be transmitted to an N4 node, but an eleventh N-type transistor NM11 and an eighteenth N-type transistor NM18 may be turn-off. A second negative voltage from NPS2 102 may not be transmitted to an output terminal OUT. Therefore, a second negative voltage could not prevent a first negative voltage from becoming an output in a circuit of a negative voltage switching device 100.

Figure 3:
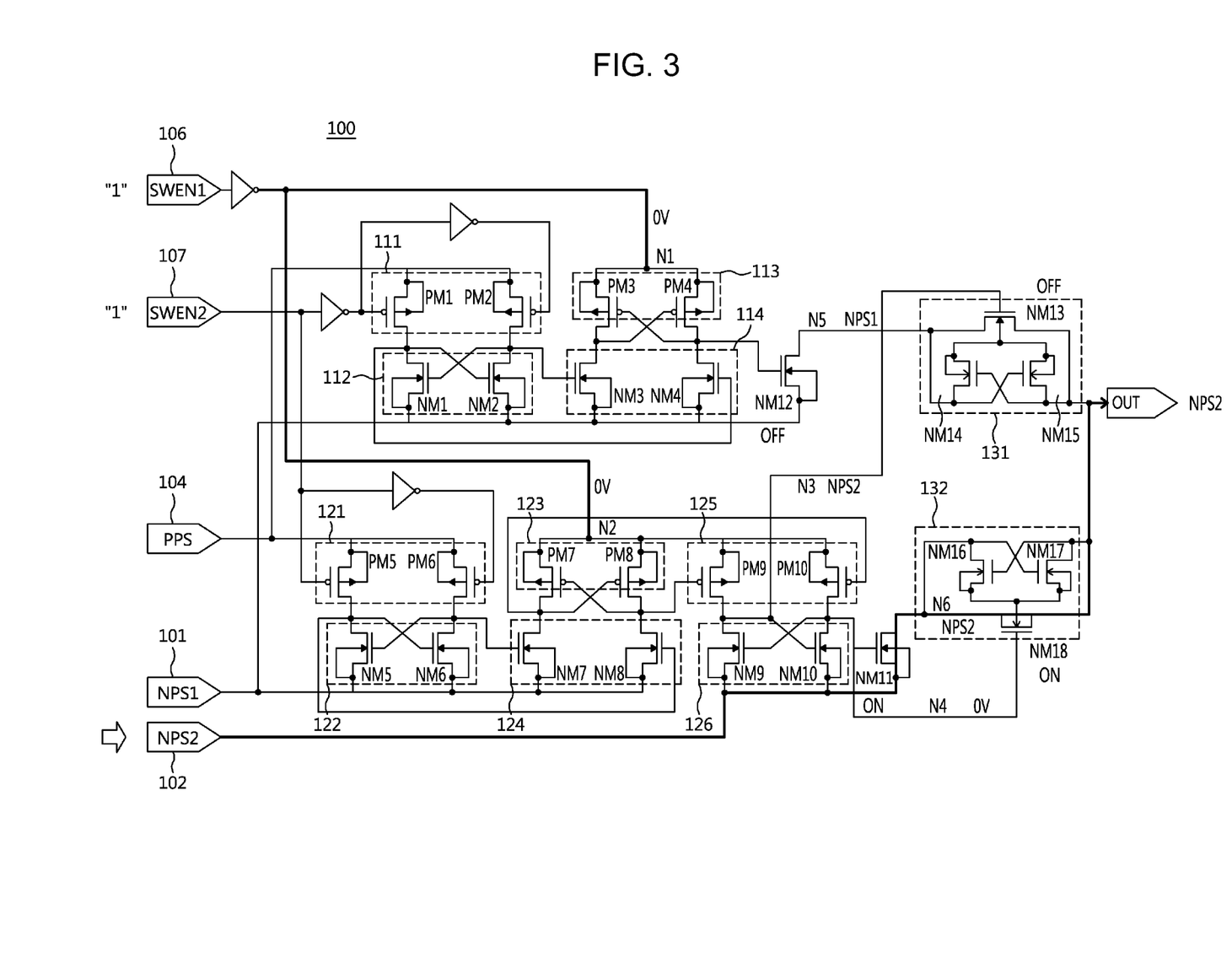
FIG. 3 illustrates an example selecting a second negative voltage in a circuit of a negative voltage switching device as shown in FIG. 1, in accordance with one or more embodiments of the disclosure.

FIG. 3 illustrates an example selecting a second negative voltage in a circuit of a negative voltage switching device as shown in FIG. 1, in accordance with one or more embodiments of the disclosure.

Referring to FIG. 3, by making SWEN2 107 be logical "1", a NPS2 102 may be transmitted to an output terminal OUT. The bolded lines illustrate a SWEN1 signal path or a NSP2 102 signal path.

By selecting a NPS2 102 and making a SWEN1 106 be logical "1", it may be possible to operate devices of a third P-type transistor PM3, a fourth P-type transistor PM4, a seventh P-type transistor PM7, an eighth P-type transistor PM8, a ninth P-type transistor PM9, a tenth P-type transistor PM10, a third N-type transistor NM3, a fourth N-type transistor NM4, a seventh N-type transistor NM7, an eighth N-type transistor NM8, a ninth N-type transistor NM9, and a tenth N-type transistor NM10 below a breakdown voltage.

0V may be supplied to an N1 node and an N2 node, and an N4 node may become 0V, resulting in turning on an eleventh N-type transistor NM11 and an eighteenth N-type transistor NM18. A second negative voltage may be transmitted to an output terminal OUT according to a NPS2 102 transmitted in an N6 node. Since a second negative voltage from NPS2 102 may be also transmitted to an N3 node, a thirteenth N-type transistor NM13 and a twelfth N-type transistor NM12 may be turn-off. A first negative voltage from NPS1 101 may not be transmitted to an output terminal OUT. Therefore, a first negative voltage could not prevent a second negative voltage from becoming an output in a circuit of a negative voltage switching device 100.

Figure 4:
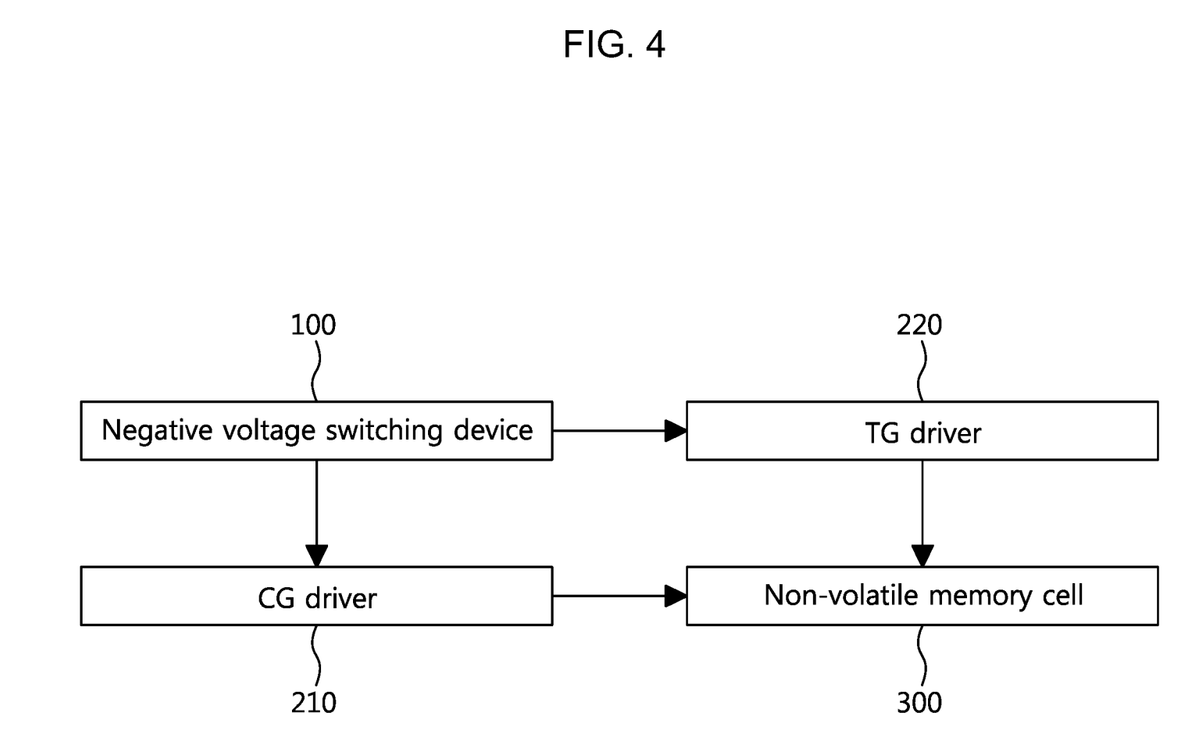
FIG. 4 illustrates an example composition of a non-volatile memory device with applying a negative voltage switching device in accordance with one or more embodiments of the disclosure.

FIG. 4 illustrates an example composition of a non-volatile memory device with applying a negative voltage switching device in accordance with one or more embodiments of the disclosure.

Referring to FIG. 4, a non-volatile memory device may include a negative voltage switching device 100, a Control Gate (CG) driver 210, a Tunneling Gate (TG) driver 220, and a non-volatile memory cell 300. Herein, an example of a negative voltage switching device 100 may include the description above, therefore, a detailed description may be omitted.

Using a negative voltage switching device 100, the CG driver 210 may receive a second negative voltage in an erase mode and a first negative voltage in a program mode.

Using a negative voltage switching device 100, the TG driver 220 may receive a first negative voltage in an erase mode and a second negative voltage in a program mode.

That is, through the negative voltage switching device 100, a second negative voltage may be supplied to a CG driver 210, and a first negative voltage may be supplied to a TG driver 220 in an erase mode.

In a program mode, a first negative voltage may be supplied to a CG driver 210, and a second negative voltage may be supplied to a TG driver 220.

An erase operation and a program operation may be performed by a CG driver 210 and a TG driver 220 in a non-volatile memory cell 300.

Accordingly, using a negative voltage switching device 100, a negative voltage desired for an erase mode and a program mode may be applied. By stably supplying a negative voltage desired to erase or program a non-volatile memory cell to each node of a cell, it may be possible to erase or program a non-volatile memory cell, such as single poly EEPROM or MTP, without an additional mask only for an NVM (non-volatile memory) in a logic process or a BCD process.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A negative voltage switching device, comprising:
a first switching circuit configured to transmit a first negative voltage;
a second switching circuit configured to transmit a second negative voltage; and
a switching selection circuit configured to select one of the first switching circuit or the second switching circuit for transmitting one of the first negative voltage and the second negative voltage to an output terminal, wherein the switching selection circuit comprises:
a first switching selection module connected to the first switching circuit and the second switching circuit; and
a second switching selection module connected to the second switching circuit.

2. The negative voltage switching device of claim 1, wherein the first switching circuit comprises:
a first switching module connected to a second control signal terminal configured to apply a control signal to select one of the first negative voltage and the second negative voltage;
a second switching module connected to a first control signal terminal configured to apply a control signal to supply the first negative voltage or the second negative voltage to the switching selection circuit; and a twelfth N-type transistor configured to supply the first negative voltage to the switching selection circuit by turning on, when the first negative voltage is selected.

3. The negative voltage switching device of claim 2, wherein first switching module comprises:
a first P-type transistor having a source connected to a positive voltage terminal to supply a positive voltage, and a gate connected to the second control signal terminal;
a second P-type transistor having a source connected to the positive voltage terminal, and a gate connected to the second control signal terminal;
a first N-type transistor having a source connected to a first negative voltage terminal to supply the first negative voltage, and a drain connected to a drain of the first P-type transistor; and
a second N-type transistor having a source connected to the first negative voltage terminal to supply the first negative voltage, and a drain connected to a drain of the second P-type transistor,
wherein the drain of the first P-type transistor and a gate of the second N-type transistor are connected, and a drain of the second P-type transistor and a gate of the first N-type transistor are connected.

4. The negative voltage switching device of claim 2, wherein the second switching module comprises:
a third P-type transistor having a source connected to the first control signal terminal;
a fourth P-type transistor having a source connected to the first control signal terminal;
a third N-type transistor having a source connected to a first negative voltage terminal to supply the first negative voltage, and a drain connected to a drain of the third P-type transistor; and
a fourth N-type transistor having a source connected to the first negative voltage terminal to supply the first negative voltage, and a drain connected to a drain of the fourth P-type transistor,
wherein a gate of the third P-type transistor and the drain of the fourth N-type transistor are connected, and a gate of the fourth P-type transistor and the drain of the third N-type transistor are connected.

5. The negative voltage switching device of claim 4, wherein
a source of the twelfth N-type transistor is connected to the first negative voltage terminal,
a gate of the twelfth N-type transistor is connected to each drain of the fourth P-type transistor and the fourth N-type transistor, and a gate of the third P-type transistor, and
a drain of the twelfth N-type transistor is connected to the switching selection circuit.

6. The negative voltage switching device of claim 1, wherein the second switching circuit comprises:
a third switching module connected to a second control signal terminal configured to apply a control signal to select one of the first negative voltage and the second negative voltage;
a fourth switching module connected to a first control signal terminal configured to apply a control signal to supply the first negative voltage or the second negative voltage to the switching selection circuit;
a fifth switching module connected to another negative voltage terminal different from a negative voltage terminal of the fourth switching module, and connected to the first control signal terminal; and an eleventh N-type transistor configured to supply the second negative voltage to the switching selection circuit by turning on, when the second negative voltage is selected.

7. The negative voltage switching device of claim 6, wherein the third switching module comprises:
a fifth P-type transistor having a source connected to a positive voltage terminal to supply a positive voltage, and a gate connected to the second control signal terminal;
a sixth P-type transistor having a source connected to the positive voltage terminal, and a gate connected to the second control signal terminal;
a fifth N-type transistor having a source connected to a first negative voltage terminal to supply the first negative voltage, and a drain connected to a drain of the fifth P-type transistor; and
a sixth N-type transistor having a source connected to a first negative voltage terminal to supply the first negative voltage, and a drain connected to a drain of the sixth P-type transistor,
wherein the drain of the fifth P-type transistor and a gate of the sixth N-type transistor are connected, and the drain of the sixth P-type transistor and a gate of the fifth N-type transistor are connected.

8. The negative voltage switching device of claim 6, wherein the fourth switching module comprises:
a seventh P-type transistor having a source connected to the first control signal terminal;
an eighth P-type transistor having a source connected to the first control signal terminal;
a seventh N-type transistor having a source connected to a first negative voltage terminal to supply the first negative voltage, and a drain connected to a drain of the seventh P-type transistor; and
an eighth N-type transistor having a source connected to the first negative voltage terminal, and a drain connected to a drain of the eighth P-type transistor,
wherein a gate of the seventh P-type transistor and the drain of the eighth N-type transistor are connected, and a gate of the eighth P-type transistor and the drain of the seventh N-type transistor are connected.

9. The negative voltage switching device of claim 6, wherein the fifth switching module comprises:
a ninth P-type transistor having a source connected to the first control signal terminal;
a tenth P-type transistor having a source connected to the first control signal terminal;
a ninth N-type transistor having a source connected to a second negative voltage terminal configured to supply the second negative voltage, and a drain connected to a drain of the ninth P-type transistor; and
a tenth N-type transistor having a source connected to the second negative voltage terminal, and a drain connected to a drain of the tenth P-type transistor,
wherein the drain of the ninth P-type transistor and a gate of the tenth N-type transistor are connected, and the drain of the tenth P-type transistor and a gate of the ninth N-type transistor are connected.

10. The negative voltage switching device of claim 9, wherein
a source of the eleventh N-type transistor is connected to the second negative voltage terminal,
a gate of the eleventh N-type transistor is connected to each drain of the tenth P-type transistor and the tenth N-type transistor, and a gate of the ninth P-type transistor, and a drain of the eleventh N-type transistor is connected to the switching selection circuit.

11. The negative voltage switching device of claim 1, wherein the first switching selection module comprises:
a thirteenth N-type transistor having a source connected to the first switching circuit, a gate connected to the second switching circuit, and a drain connected to an output terminal;
a fourteenth N-type transistor having a drain connected to the first switching circuit, a gate connected to the output terminal, and a source connected to the thirteenth N-type transistor; and
a fifteenth N-type transistor having a drain connected to the output terminal, a gate connected to the source of the fourteenth N-type transistor, and a source connected to the thirteenth N-type transistor.

12. The negative voltage switching device of claim 1, wherein the second switching selection module comprises:
a sixteenth N-type transistor having a source connected to the second switching circuit, and a gate is connected to the output terminal;
a seventeenth N-type transistor having a drain connected to the output terminal, a gate connected to the second switching circuit, and a source connected to a source of the sixteenth N-type transistor; and
an eighteenth N-type transistor having a source connected to the second switching circuit, a gate connected to each source of the sixteenth N-type transistor and the seventeenth N-type transistor, and a drain connected to the output terminal.

13. The negative voltage switching device of claim 1, wherein the first negative voltage is higher than the second negative voltage.

14. A non-volatile memory device, comprising:
a negative voltage switching device, comprising:
a first switching circuit configured to transmit a first negative voltage;
a second switching circuit configured to transmit a second negative voltage; and
a switching selection circuit configured to select one of the first switching circuit or the second switching circuit for transmitting one of the first negative voltage and the second negative voltage to an output terminal;
a CG driver configured to receive the first negative voltage in a program mode and the second negative voltage in an erase mode using the negative voltage switching device;
a TG driver configured to receive the second negative voltage in the program mode and the first negative voltage in the erase mode using the negative voltage switching device; and
a non-volatile memory cell where an erase operation of the erase mode and a program operation of the program mode are performed by the CG driver and the TG driver, respectively.

15. The non-volatile memory device of claim 14, wherein the first switching circuit comprises:
a first switching module connected to a second control signal terminal configured to apply a control signal to select one of the first negative voltage and the second negative voltage;
a second switching module connected to a first control signal terminal configured to apply a control signal to supply the first negative voltage or the second negative voltage to the switching selection circuit; and a twelfth N-type transistor configured to supply the first negative voltage to the switching selection circuit by turning on, when the first negative voltage is selected.

16. The non-volatile memory device of claim 15, wherein the first switching module comprises:
a first P-type transistor having a source connected to a positive voltage terminal to supply a positive voltage, and a gate connected to the second control signal terminal;
a second P-type transistor having a source connected to the positive voltage terminal, and a gate connected to the second control signal terminal;
a first N-type transistor having a source connected to a first negative voltage terminal to supply the first negative voltage, and a drain connected to a drain of the first P-type transistor; and
a second N-type transistor having a source connected to the first negative voltage terminal to supply the first negative voltage, and a drain connected to a drain of the second P-type transistor,
wherein the drain of the first P-type transistor and a gate of the second N-type transistor are connected, and a drain of the second P-type transistor and a gate of the first N-type transistor are connected.

17. The non-volatile memory device of claim 15, wherein the second switching module comprises:
a third P-type transistor having a source connected to the first control signal terminal;
a fourth P-type transistor having a source connected to the first control signal terminal;
a third N-type transistor having a source connected to a first negative voltage terminal to supply the first negative voltage, and a drain connected to a drain of the third P-type transistor; and
a fourth N-type transistor having a source connected to the first negative voltage terminal to supply the first negative voltage, and a drain connected to a drain of the fourth P-type transistor,
wherein a gate of the third P-type transistor and the drain of the fourth N-type transistor are connected, and a gate of the fourth P-type transistor and the drain of the third N-type transistor are connected.

18. The non-volatile memory device of claim 17, wherein
a source of the twelfth N-type transistor is connected to the first negative voltage terminal,
a gate of the twelfth N-type transistor is connected to each drain of the fourth P-type transistor and the fourth N-type transistor, and a gate of the third P-type transistor, and
a drain of the twelfth N-type transistor is connected to the switching selection circuit.

19. The non-volatile memory device of claim 14, wherein the second switching circuit comprises:
a third switching module connected to a second control signal terminal configured to apply a control signal to select one of the first negative voltage and the second negative voltage;
a fourth switching module connected to a first control signal terminal configured to apply a control signal to supply the first negative voltage or the second negative voltage to the switching selection circuit;
a fifth switching module connected to another negative voltage terminal different from a negative voltage terminal of the fourth switching module, and connected to the first control signal terminal; and an eleventh N-type transistor configured to supply the second negative voltage to the switching selection circuit by turning on, when the second negative voltage is selected.

20. The non-volatile memory device of claim 19, wherein the third switching module comprises:
a fifth P-type transistor having a source connected to a positive voltage terminal to supply a positive voltage, and a gate connected to the second control signal terminal;
a sixth P-type transistor having a source connected to the positive voltage terminal, and a gate connected to the second control signal terminal;
a fifth N-type transistor having a source connected to a first negative voltage terminal to supply the first negative voltage, and a drain is connected each other to a drain of the fifth P-type transistor; and
a sixth N-type transistor having a source connected to a first negative voltage terminal to supply the first negative voltage, and a drain connected to a drain of the sixth P-type transistor,
wherein the drain of the fifth P-type transistor and a gate of the sixth N-type transistor are connected, and the drain of the sixth P-type transistor and a gate of the fifth N-type transistor are connected.

21. The non-volatile memory device of claim 19, wherein the fourth switching module comprises:
a seventh P-type transistor having a source connected to the first control signal terminal;
an eighth P-type transistor having a source connected to the first control signal terminal;
a seventh N-type transistor having a source connected to a first negative voltage terminal to supply the first negative voltage, and a drain connected to a drain of the seventh P-type transistor; and
an eighth N-type transistor having a source connected to the first negative voltage terminal, and a drain connected to a drain of the eighth P-type transistor,
wherein a gate of the seventh P-type transistor and the drain of the eighth N-type transistor are connected, and a gate of the eighth P-type transistor and the drain of the seventh N-type transistor are connected.

22. The non-volatile memory device of claim 19, wherein the fifth switching module comprises:
a ninth P-type transistor having a source connected to the first control signal terminal;
a tenth P-type transistor having a source connected to the first control signal terminal;
a ninth N-type transistor having a source connected to a second negative voltage terminal configured to supply the second negative voltage, and a drain connected to a drain of the ninth P-type transistor; and
a tenth N-type transistor having a source connected to the second negative voltage terminal, and a drain connected to a drain of the tenth P-type transistor,
wherein the drain of the ninth P-type transistor and a gate of the tenth N-type transistor are connected, and the drain of the tenth P-type transistor and a gate of the ninth N-type transistor are connected.

23. The non-volatile memory device of claim 22, wherein
a source of the eleventh N-type transistor is connected to the second negative voltage terminal,
a gate of the eleventh N-type transistor is connected to each drain of the tenth P-type transistor and the tenth N-type transistor, and a gate of the ninth P-type transistor, and
a drain of the eleventh N-type transistor is connected to the switching selection circuit.

24. The non-volatile memory device of claim 14, wherein the switching selection circuit comprises:
a first switching selection module connected to the first switching circuit and the second switching circuit; and
a second switching selection module connected to the second switching circuit.

25. The non-volatile memory device of claim 24, wherein the first switching selection module comprises:
a thirteenth N-type transistor having a source connected to the first switching circuit, a gate connected to the second switching circuit, and a drain connected to an output terminal;
a fourteenth N-type transistor having a drain connected to the first switching circuit, a gate connected to the output terminal, and a source connected to the thirteenth N-type transistor; and
a fifteenth N-type transistor having a drain connected to the output terminal, a gate connected to the source of the fourteenth N-type transistor, and a source connected to the thirteenth N-type transistor.

26. The non-volatile memory device of claim 24, wherein the second switching selection module comprises:
a sixteenth N-type transistor having a source connected to the second switching circuit, and a gate is connected to the output terminal;
a seventeenth N-type transistor having a drain connected to the output terminal, a gate connected to the second switching circuit, and a source connected to a source of the sixteenth N-type transistor; and
an eighteenth N-type transistor having a source connected to the second switching circuit, a gate connected to each source of the sixteenth N-type transistor and the seventeenth N-type transistor, and a drain connected to the output terminal.

27. The non-volatile memory device of claim 14, wherein the first negative voltage is higher than the second negative voltage.

* * * * *